US007610567B2

(12) United States Patent
Manohar

(10) Patent No.: US 7,610,567 B2
(45) Date of Patent: Oct. 27, 2009

(54) SYSTEMS AND METHODS FOR PERFORMING AUTOMATED CONVERSION OF REPRESENTATIONS OF SYNCHRONOUS CIRCUIT DESIGNS TO AND FROM REPRESENTATIONS OF ASYNCHRONOUS CIRCUIT DESIGNS

(75) Inventor: Rajit Manohar, Ithaca, NY (US)

(73) Assignee: Achronix Semiconductor Corporation, San Jose, CA (US)

( * ) Notice: Subject to any disclaimer, the term of this patent is extended or adjusted under 35 U.S.C. 154(b) by 147 days.

(21) Appl. No.: 11/740,184

(22) Filed: Apr. 25, 2007

(65) Prior Publication Data

US 2007/0256038 A1    Nov. 1, 2007

Related U.S. Application Data

(60) Provisional application No. 60/796,126, filed on Apr. 27, 2006.

(51) Int. Cl.
*G06F 17/50* (2006.01)
(52) U.S. Cl. .............................................. 716/3; 716/6
(58) Field of Classification Search ........................ None
See application file for complete search history.

(56) References Cited

U.S. PATENT DOCUMENTS

| | | | |
|---|---|---|---|
| 6,301,655 | B1 | 10/2001 | Manohar et al. |
| 6,381,692 | B1 | 4/2002 | Martin et al. |
| 6,658,550 | B2 | 12/2003 | Martin |
| 6,690,203 | B2 | 2/2004 | Nystrom et al. |
| 7,157,934 | B2 | 1/2007 | Teifel |
| 2002/0156995 | A1 | 10/2002 | Martin et al. |
| 2002/0166003 | A1 | 11/2002 | Nystrom et al. |
| 2005/0160392 | A1* | 7/2005 | Sandbote ..................... 716/18 |
| 2006/0075210 | A1 | 4/2006 | Manohar et al. |
| 2006/0120189 | A1* | 6/2006 | Beerel et al. ................. 365/203 |
| 2006/0233006 | A1 | 10/2006 | Fant |
| 2007/0200608 | A1 | 8/2007 | Fang et al. |
| 2007/0253240 | A1 | 11/2007 | Manohar et al. |

(Continued)

FOREIGN PATENT DOCUMENTS

WO    WO-2007127914 A3    11/2007

OTHER PUBLICATIONS

Branover et al., "Asynchronous Design By Conversion: Converting Synchronous Circuits into Asynchronous Ones," Proc. of DATE'04, 2004 IEEE, 6 pages.*

(Continued)

*Primary Examiner*—Leigh Marie Garbowski
(74) *Attorney, Agent, or Firm*—Schwegman, Lundberg & Woessner, P.A.

(57) ABSTRACT

Methods and systems automate an approach to provide a way to convert a circuit design from a synchronous representation to an asynchronous representation without any designer or user interaction or redesign of the synchronous circuit. An optimized, automated, non-Interactive conversion of representations of synchronous circuit designs to and from representations of asynchronous circuit designs, facilitating traditional electronic design automation (EDA) tools to process and manipulate asynchronous designs while allowing synchronous designs to be implemented using asynchronous hardware solutions. The invention also facilitates feedback to synchronous design tools in synchronous representation for optimization and iteration of the design process by engineers, eliminating the need for engineers to be aware of the underlying asynchronous architecture of the underlying hardware implementation.

24 Claims, 7 Drawing Sheets

U.S. PATENT DOCUMENTS

2007/0256038 A1 11/2007 Manohar
2007/0262786 A1 11/2007 Manohar et al.

OTHER PUBLICATIONS

Blunno et al., "Handshake protocols for de-synchronization," Proc. of ASYNC'04, 2004 IEEE, 10 pages.*

Amde et al., "Automating the Design of an Asynchronous DLX Microprocessor," DAC 2003, pp. 502-507.*

Mercer, Eric, et al., "Stochastic cycle period analysis in timed circuits", *University of Utah Masters Thesis*, Electrical Engineering Department, University of Utah,(May 1999),78 pgs.

Mercer, E. G., et al., "Stochastic cycle period analysis in timed circuits", *The 2000 IEEE International Symposium on Circuits and Systems, 2000. Proceedings. ISCAS 2000 Geneva*. vol. 2, (2000),172-175.

Peng, Song, et al., "Automated synthesis for asynchronic FPGAs", *Published in Symposium on Field Programmable Gate Arrays; Computer Systems Laboratory*, Cornell University, Ithaca NY, (2005),11 pgs.

Teifel, John, et al., "Static Tokens: Using Dataflow to Automate Concurrent Pipeline Synthesis", *In 10th Int'l Symposium on Advanced Research in In Asynchronous Circuits and Systems*, pp. 17-27, Computer Systems Laboratory, Cornell University, Ithaca, NY,(Apr. 2004),11 pgs.

* cited by examiner

SYSTEMS AND METHODS FOR PERFORMING AUTOMATED CONVERSION OF REPRESENTATIONS OF SYNCHRONOUS CIRCUIT DESIGNS TO AND FROM REPRESENTATIONS OF ASYNCHRONOUS CIRCUIT DESIGNS

CROSS-REFERENCE TO RELATED APPLICATIONS

This application claims the benefit of U.S. patent application Ser. No. 60/796,126 filed Apr. 27, 2006.

FIELD OF THE INVENTION

The present invention relates generally to electronic circuit design and more particularly to methods and systems for converting between synchronous and asynchronous circuit designs.

BACKGROUND OF THE INVENTION

Traditional synchronous circuit designs are represented using a variety of hardware description languages, higher level description languages, netlists, and schematics. All of these synchronous representations define the functionality of the circuits in the presence of a clock signal or with a master timing signal used to synchronize operations. To utilize an asynchronous architecture to implement the same synchronous circuit, the synchronous representation must be translated into an asynchronous representation. To accomplish this goal, there have been generally known to be two fundamental approaches:

1) Redesign the circuit using an asynchronous representation.

2) Convert the existing synchronous representation into an asynchronous representation.

Approach (1) above is time intensive and involves re-implementing an entire design for execution in an asynchronous architecture. This is an approach that is not generally acceptable to designers. It is costly in terms of time and requires that designers learn a completely new way to represent circuit designs; in an asynchronous format. The field of asynchronous design is an old field encompassing significant prior art.

Approach (2)—converting an existing synchronous representation into an asynchronous representation—is an approach the present inventors believe would be both valuable to and favored by circuit designers if such an approach did not require any knowledge of asynchronous circuits by the designer.

Automated conversion of synchronous circuit designs to asynchronous representations have been discussed, but to the best knowledge of the inventors, has never been implemented in an effective, commercially viable solution. No existing art addresses the problem of converting synchronous circuit designs in the presence of multiple clock domains, latches and flip-flops (positive and negative triggered), and clock gating. No existing art exists, to the best knowledge of the inventors, which can generate asynchronous conditional block designs from synchronous designs. Also, there is no prior work known to the inventors whereby to convert a synchronous system into an asynchronous design while preserving the illusion of synchrony on the primary inputs and outputs.

SUMMARY OF THE INVENTION

The invention includes methods and systems, typically but not always implemented in the form of software, to automate the conversion of a circuit design from a synchronous representation to an asynchronous representation without any designer or user interaction or redesign of the synchronous circuit.

In one embodiment of the invention, there are provided methods and systems for converting between an asynchronous circuit design and a synchronous circuit design, one method comprising:

identifying a synchronous design;

generating a synchronous netlist of the synchronous design; and converting the synchronous netlist to an asynchronous design.

By providing an optimized, automated, non-Interactive conversion of representations of synchronous circuit designs to and from representations of asynchronous circuit designs, the invention allows traditional electronic design automation (EDA) tools to process and manipulate asynchronous designs while allowing synchronous designs to be implemented using asynchronous hardware solutions. The invention also facilitates feedback to synchronous design tools in synchronous representation for optimization and iteration of the design process by engineers. The inventive method can also preserve the illusion of synchrony at the primary inputs and outputs of the circuit being converted.

It will be understood that, upon the conversion of a synchronous design to an asynchronous design representation, the asynchronous design representation can be straight-forwardly fabricated using conventional techniques into a hardware circuit, for example in the form of a field-programmable gate array (FPGA).

DESCRIPTION OF THE DRAWING FIGURES

These and other objects, features and advantages of the present invention will be apparent from a consideration of the Detailed Description of the Invention in combination with the drawing Figures, in which.

DETAILED DESCRIPTION OF THE INVENTION

Figure 1:
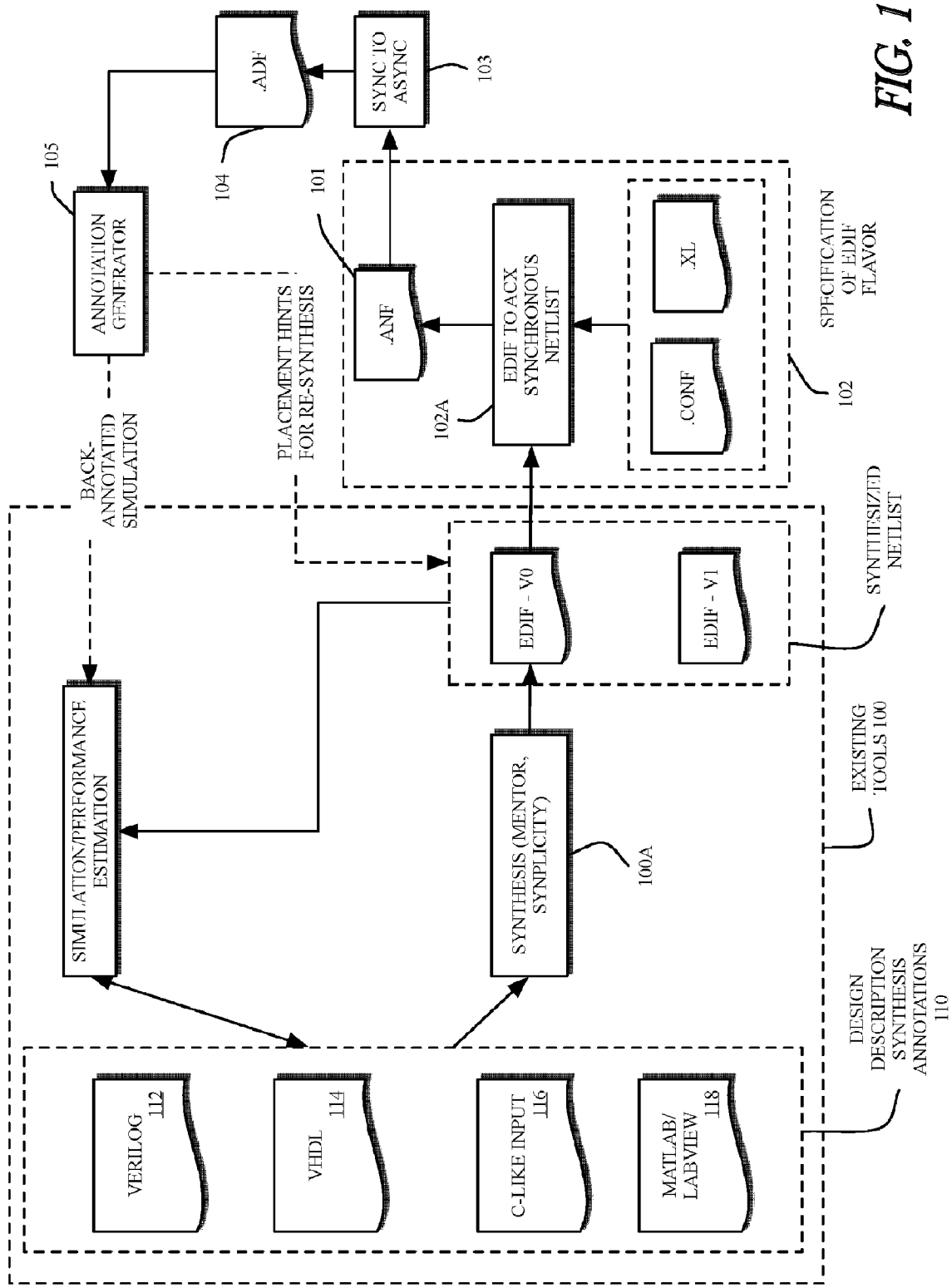
FIG. 1 is a flow chart illustrating a process in accordance with the present invention.

The invention is a method for converting a synchronous design into an asynchronous one with equivalent functionality. The method is general in that it can convert circuits with an arbitrary number of clock domains as long as the frequency of each clock domain is known beforehand. The method can also handle common features such as clock gating, combinations of positive edge-triggered and negative edge-triggered flip-flops, as well as latches. The method also includes provisions for making any asynchronous signal behave completely synchronously. This can be applied to the primary inputs and outputs of the circuit to hide the asynchronous nature of its core implementation, or to any intermediate signal to enable synchronous scan-testing or synchronous debugging of a design.

The input to the algorithm is a description of a synchronous netlist with additional auxiliary information that is normally required for synthesis. This information includes the set of clocks and their frequencies (in the case of one clock signal, the frequency is not required), the set of multi-cycle paths (if any), and any constraints on input and output signals with respect to the appropriate clocks. In addition, any signals that must be kept synchronous are also specified. By default, the algorithm assumes that all primary inputs and outputs are synchronous. For the purposes of concreteness, we will discuss the case when the synchronous netlist is generated by an existing synthesis tool such as Synplicity's Synplify Pro™ or Mentor Graphics' Precision Synthesis™ software packages.

As is well known in the art, the Synplify Pro™ and Precision Synthesis™ each comprise a representative field programmable gate array synthesis tool, the function of which is to convert register transfer level circuit behavior into an FPGA design implementation. The netlists generated by such tools are used to describe the actual connectivity of the electronic circuits.

A synchronous netlist contains a set of gates that are combinational logic, and another set of gates that are state-holding. We consider four types of state-holding gates: positive edge-triggered flip-flops (PFLOPs), negative edge-triggered flip-flops (NFLOPs), latches that are transparent when their clock input is high (PLATCH), and latches that are transparent when their clock input is low (NLATCH). Since synthesis tools can eliminate generated clocks and replace them with combinations of clocks and clock enables, for simplicity we assume that all clock signals used by state-holding elements are primary clock inputs to the circuit. Our current implementation uses the EDIF 2 0 0 standard as the language used to represent the synchronous netlist, although any other language, for example, Verilog™ could be used as well.

As is known in the art, EDIF stands for electronic design interchange format, which has been predominantly used as a neutral format in which to store electronic net lists and schematics. The EDIF format standardizes proprietary formats into a neutral format. EDIF 2 0 0 represents an early release of the format, and has subsequently been supplemented with EDIF 3 0 0 and EDIF 4 0 0.

Figure 7:
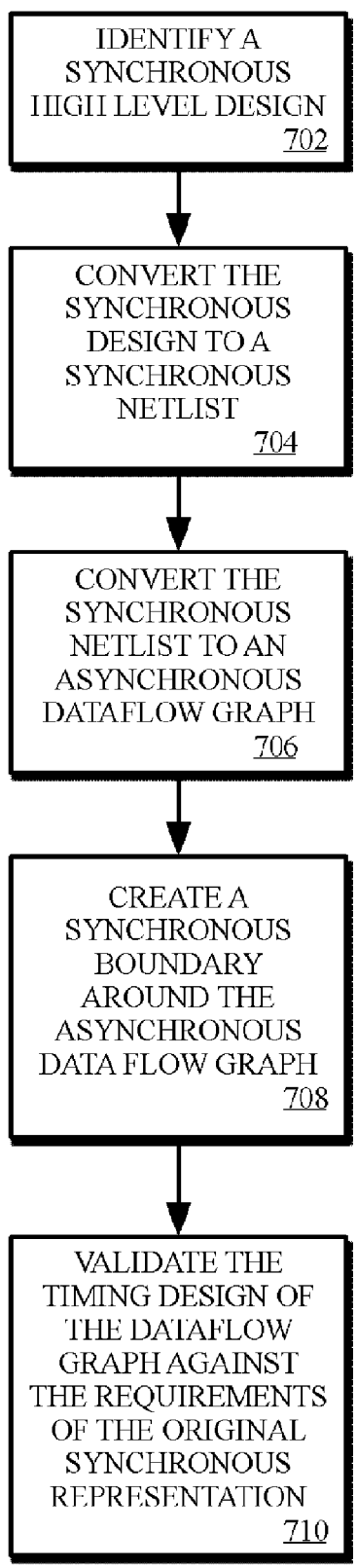
FIG. 7 is a flow chart showing an overview of a process for converting between representations of synchronous and asynchronous circuit designs.

The high-level flow for the conversion method of the present invention is shown in FIG. 1. With reference now to both FIG. 1 (showing the block diagram) and FIG. 7 (showing the process 700), input to the entire tool flow is described in an existing hardware-description language (HDL) 110 such as Verilog™ 112, VHDL™ 114, a C-like input 116, MATLAB/LABVIEW 118, or any other language that is supported by the synchronous synthesis tools (702). Existing tools 100 can be used to simulate the high-level description, as well as synthesize it into a synchronous netlist in a variety of formats including EDIF 2 0 0.

In the described embodiment of the invention, there is implemented a tool 102 that takes the EDIF as input, as well as a table that specifies the "black-box" modules in the EDIF (e.g. the fact that the EDIF cell name "AND2" is a two-input AND gate, etc) and some details about the EDIF format that may vary from one synthesis tool to the other. The conversion from EDIF into a standardized netlist format (step 704) is done in a standard process 102A using one of the synthesis tools 100A described herein above. The final output of the EDIF reader 102 is a standardized synchronous netlist 101. The synchronous netlist 101 contains all the necessary information outlined above. Also, it is very easy to identify the different parts of the design, including clocks, clock enables, PFLOPs, NFLOPs, PLATCHes, and NLATCHes because the EDIF generated by existing synthesis tools 100 has these entities clearly labeled.

As is known in the art, the .conf file in tool 102 is a configuration file used to specify the output format of the synthesis tool, while the .xl file is a library file containing the description of the library elements used by the synthesis tool. The .anf file contains the resulting synchronous netlist. Any file formats can be used to specify this information, or the information necessary could be built into the conversion tool 102A (e.g., EDIF TO ACX SYNCHRONOUS NETLIST block) itself.

Continuing with respect to FIG. 1, the synchronous netlist 101 is then converted to an asynchronous format 104 using the synchronous to asynchronous conversion method 103, the asynchronous format for example in the form of a data flow graph (step 706). This asynchronous implementation is equivalent to the synchronous one in terms of the computation performed. The described conversion method includes a method for generating annotations that translate the performance characteristics of the asynchronous implementation back into the synchronous domain using an annotation generator 105 (step 708) for validating the timing design (step 710) of the dataflow graph against the requirements of the original synchronous representation, as described herein below. This can be performed, for example, by bounding the asynchronous dataflow graph to create a synchronous view of the inputs and outputs. The invention thus enables the conversion of the synchronous netlist into an asynchronous implementation, as well as the annotation generator to map the performance characteristics from the asynchronous domain into the synchronous domain. Other formats than a dataflow graph into which the synchronous netlist may be converted include, for example, the detailed description of the implementation of the dataflow graph using say Verilog or VHDL, or even other high-level languages such as SystemC, Handel C, or C augmented with message-passing operations. The details of the language are not restrictive, as should be evident to someone with ordinary skill in the art.

The target asynchronous netlist represents circuits that can be implemented efficiently as fine-grained asynchronous pipelines or synchronous dataflow pipelines. The target netlist is represented as a dataflow graph. Nodes in the dataflow graph operate on data values, referred to as tokens. A token is a data item that can flow through a pipeline. A token could be a one-bit value or a multi-bit value. Operators in the dataflow graph receive tokens on their inputs and produce tokens on their outputs. The change in the value of the token is used to compute results. Connectivity between operators is specified by arrows, that correspond to communication channels along which tokens can be sent and received. Communication channels have no buffering, and sending and receiving a token on a channel corresponds to rendezvous synchronization.

As is known in the art, fine-grained asynchronous pipelines comprise small cells of logic circuits communicating through asynchronous channels, and provide the benefits of robustness and high-throughput in comparison to bundled data pipelines.

Figure 2:
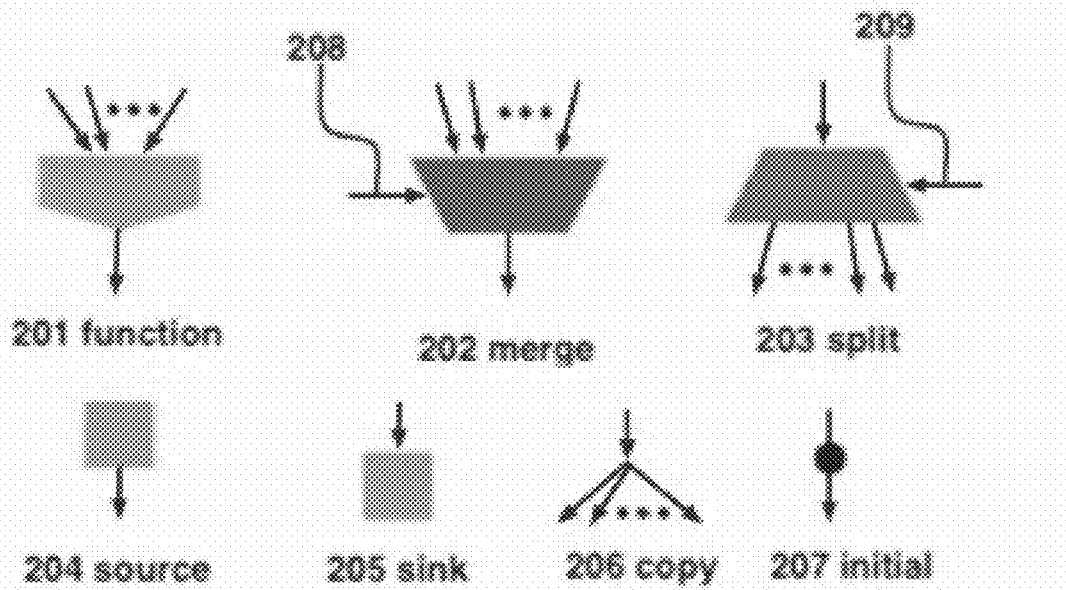
FIG. 2 is a diagram of circuit elements, the functions of which are described here in below.

The basic building blocks of a dataflow graph are shown in and described now with respect to FIG. 2. The primary unit for computing is the function block 201, which has an arbitrary number of inputs and one output. The function block receives tokens from all its inputs, computes a specified function, and produces the result of the function as an output token on its output. There can be many different types of function blocks that vary in the number of inputs they have, and in the operation they perform. Source 204 is an operator that generates an infinite stream of tokens on its output that always have the same value. Sink 205 is an operator that simply consumes any input token. Copy 206 is block that replicates the token received on its input to all its outputs. Initial block 207 begins by transmitting a token on its output, and thereafter copies any input token to its output. These blocks 201, 204, 205, 206, and 207 repeatedly receive one token on each of their inputs (if any), and send one token on each of their outputs (if any).

The merge block 202 has two types of inputs: data inputs (like every other block), and the special control input 208. The value of the control input specifies the data input from which a token is received. This token is then sent on the output of the merge. The split block 203 has a dual function. It receives a control value on its control input 209, and a data value on its data input. It sends the data value on the output channel specified by the value of the control input.

As is known in the art, a data flow graph is a graphical representation of the flow of data through an information system, in the present context an asynchronous circuit or gate array. As described above, the various elements shown in FIG. 2 are the basic building blocks for constructing data flow graphs, several of which are described in detail below.

Figure 3A:
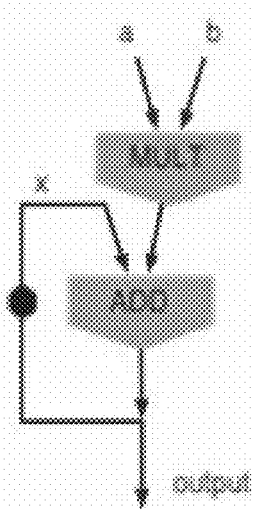
FIGS. 3A and 3B are diagrams of circuits, the functions of which are described here in below.
Figure 3B:
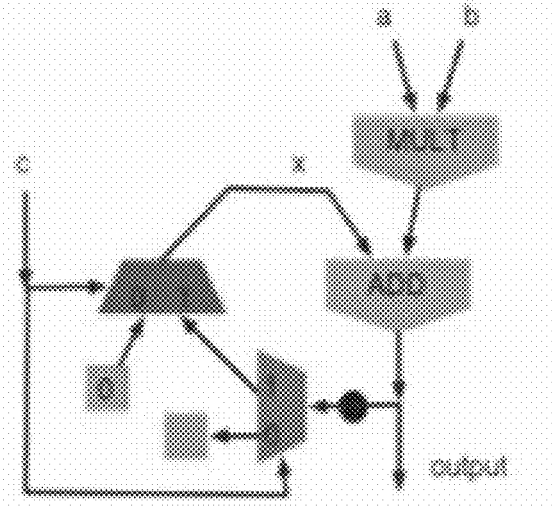

FIG. 3A shows an example dataflow graph that corresponds to the arithmetic operation where the value of x is replaced with x+ab and this updated value is produced on the output. Input tokens arrive on inputs a and b, and they are multiplied together by MULT and added to the current value of x using function ADD. This updated value is produced on the output as well as fed back into the input of the adder ADD. A modified version of this operation that takes an additional input c as input is shown in FIG. 3B. In FIG. 3B, a split and a merge are used in combination with control signals to introduce the option of passing a value c to the output. If c is zero, the current value of x is replaced with 0; otherwise if c is 1, the dataflow graph behaves like the one in FIG. 3(a).

The synchronous to asynchronous conversion algorithm maps a synchronous netlist into a dataflow graph that performs the same computation. Each signal is mapped to an edge in the dataflow graph (like the labeled edges in FIG. 3), and the different gates from the synchronous netlist are translated into dataflow operators.

Conversion without Multiple Clock Domains or Clock Gating.

Figure 8:
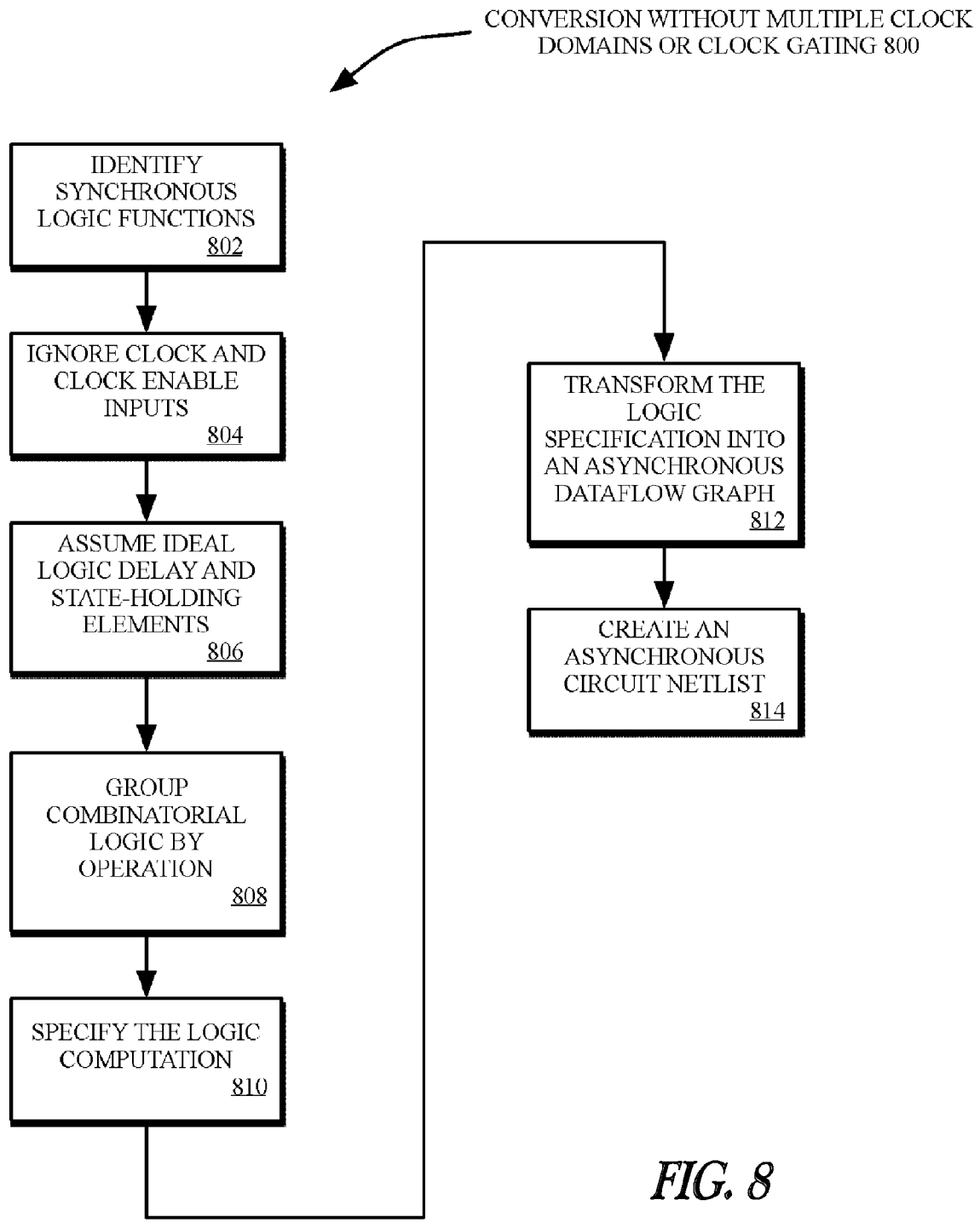
FIG. 8 is a flow chart of a process for converting an asynchronous netlist to an asynchronous dataflow graph.

With reference now to FIG. 8, it will be seen how the basic conversion process (shown in FIG. 8 as 800, an expansion of the above-described process for converting a synchronous HDL design into an asynchronous netlist) operates on a synchronous circuit that is in one clock domain, and where none of the state-holding elements are clock-gated. The algorithm operates by determining the computation being performed by the synchronous circuit, and then implementing the same computation using a dataflow graph. First we identify the synchronous logic functions (802). Let SPF, SNF, SPL, and SNL be all the PFLOPs, NFLOPs, PLATCHes, and NLATCHes respectively. For each gate g, we have input signals in(g) and output signals out(g). We ignore the clock and clock enable inputs since the basic algorithm corresponds to one clock domain and no clock gating (804) and therefore there are no clock enable inputs that are used. Each signal in out(SPF) is updated on the rising edge of the clock, and each signal in out(SNF) is updated on the negative edge of the clock. Every signal in out(SPL) is updated while the clock is high, and the stable value is latched when the clock makes a high to low transition. Every signal in out(SNL) is updated while the clock is low, and the stable value is latched when the clock makes a low to high transition. The conversion method described below assumes ideal state-holding element behavior.

Since mixing latches and flip-flops is error-prone because the result may depend on timing, we adopt a policy of assuming that the combination logic is very fast—for instance, this means that if the output of a PLATCH is connected to another PLATCH through combinational logic, our baseline conversion method will assume that the delay through the combinational logic is small enough that a race-through will occur (806), that is that the signal values will propagate through the logic elements within one clock cycle or half clock cycle, depending on the type of synchronous logic functions being considered. This model of assuming "ideal" (i.e. almost zero) combination logic delay is well-known, and commonly used when simulating the functional behavior of a synchronous circuit. It is very simple to extend the algorithm to cover the case when race-through does not occur, and we will discuss that as well. We also assume that there are no race-through cycles. In other words, we assume that every cycle contains either a flip-flop, or both a PLATCH and NLATCH.

We group connected gates of combinational logic into functions that correspond to the operation being performed (808). For each input signal s to a state-holding element, we have a function fs(x), where x are the signals that determine s, and fs is a function that corresponds to the combinational logic that generates s. (Note that fs may be the identity function.) The variables x are the outputs of state-holding elements. The combinational logic is always executing the operation "s:=fs(x)," and in what follows we assume that any combination logic assignment of this nature is executed immediately after any assignment to a variable in x. This execution is a firing of the logic. Next, we describe the computation as it updates the inputs and outputs of all state-holding elements (810).

At the beginning of the cycle when the clock is low, the last action taken by the clock was a high-to-low transition. Therefore, the first thing that occurs is that all the outputs of the NFLOPs are updated with the current value of the inputs. In other words, we execute the assignment "y:=yin" for each NFLOP where yin is the input to the flop and y is the output from the flop. All dependent combinational logic fires. Finally, the assignment "y:=yin" is performed for all NLATCHes, because the latches are open. Once again, all dependent logic fires. The other half-cycle is symmetric, and we examine PFLOPs and PLATCHes. This sequence of operations faithfully mimics the operation of a synchronous circuit.

The initial values of all state-holding elements are specified by the condition of the synchronous circuit when its global reset signal is asserted. If the initial value is unspecified, we can pick an arbitrary value. For completeness, we begin the computation with an initial value assignment to the output of every state-holding element.

Once we have the specification of the computation written in the form described above, it is a simple matter to transform this into an asynchronous dataflow graph (step 812) from which an asynchronous circuit netlist can be created (step 814). An example conversion algorithm is to use the static token form representation, and generate a dataflow graph from the computation described above. These are public-domain methods that have been developed to perform this conversion. See, for example, *Static Tokens: Using Dataflow to Automate Concurrent Pipeline Synthesis*, Teifel, John and Manohar, Rajit, Computer Systems Laboratory, Cornell University, Ithaca, N.Y. 14853.

If required, the asynchronous dataflow graph can then be converted into an FPGA netlist, for example using the methods outlined in *Automated Synthesis for Asynchronous FPGAs*, Peng, Song, Fang, David, Teifel, John, and Manohar, Rajit, Computer Systems Laboratory, Cornell University, Ithaca N.Y. 14853.

In the special case where the design contains only positive edge-triggered flip-flops and combinational logic, the effect of this transformation can be easily described as follows: (i) Replace every combinational logic gate with a dataflow function block, where the function implements the truth-table of the logic gate; (ii) Replace every flip-flop with an initial token that corresponds to the initial value of the flip-flop. The resulting asynchronous data flow graph is a valid implementation of the synchronous circuit, and the detailed description outlined above would produce this graph.

Multiple Clock Domain Conversion.

The presence of multiple clock domains only slightly complicates matters. The only issues arise at the interface between two state-holding elements from different clock domains. We assume that the clock cycle times are rational multiples of each other. If that is indeed the case, then we can statically unroll the computation to find a repeating period that corresponds to the least common multiple of all the cycle times in the computation. At that point, we can use the same algorithm as outlined above, except we must keep the state-holding elements from each clock domain separate. Each "step" in the computation corresponds to a change in the next clock signal. The appropriate latches and flop variables are updated as before, but only for the domain of the clock that changed.

Clock Gating and Implied Gating.

State-holding elements with gated clocks can be converted in two ways: (i) By eliminating the gating by using a MUX-transformation (an example for a PFLOP is illustrated in FIG. 4) thereby eliminating the gated clock entirely; (ii) By using the gating information to make the output of the PFLOP a conditional signal. The first option results in a circuit that can be converted using the method described above. The second option is the alternative we describe in more detail next. We begin with the MUX-transformed circuit to show that the synthesis we are examining in option two is more general than simply clock gating.

Figure 4A:
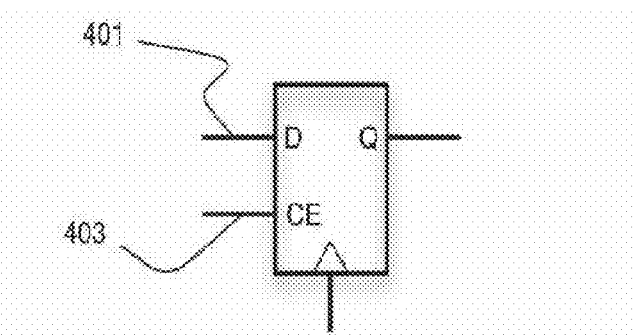
FIGS. 4A and 4B show, respectively, a diagram of circuit elements and a diagram of that circuit element incorporated into a circuit, the functions of which are described here in below.
Figure 4B:
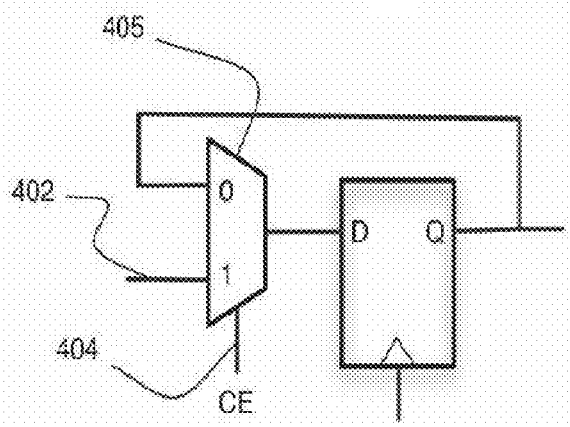

FIG. 4 shows the MUX-transformation for a PFLOP. The original PFLOP is shown in FIG. 4A, with its data input 401 and the clock enable 403. To implement the same functionality without a clock enable, we introduce the MUX 405. The original output Q of the PFLOP is fed to the "0" input of the MUX, and the original input 402 is connected to the "1" input of the MUX. Finally, the original clock enable signal CE is connected to the control input 404 of the MUX. This implements the same computation as the original clock-gated flip-flop.

The MUX 405 is a special case of the following situation. There are cases when combination logic does not depend on the value of some of the input signals. In the case of the MUX 405, when the CE signal 404 is low, the output of the MUX does not depend on signal 402; similarly, when CE is high, the output does not depend on signal Q. The signal 404 is said to be a control predicate.

The control predicates can be used to generate conditional blocks as follows. Consider a combinational logic block described by the function f(c;x) where signal c is the control predicate, and x is a vector corresponding to the rest of the signals required to compute the output of the combinational logic. The Shannon expansion for f can be written as c f(1; x)+(~c) f(0;x) where ~c is the complement of c, + denotes OR, and multiplication denotes AND. If the output of the combinational logic is signal y, then the baseline conversion method would include assignments of the form "y:=f(c;x)". We can replace these with the following conditional assignment:

IF c THEN y:=f(1;x) ELSE y:=f(0;x) ENDIF.

Note that because c is a control predicate, the two versions of f in this statement would not both require all the inputs specified in vector x. Such a statement, when transformed using the static token form algorithm outlined above, would result in conditional blocks being generated during dataflow conversion. Note that while parts of the vector might be conditional, the signal c is not conditional.

As is well known in the art, the Shannon expansion develops the idea that Boolean functions can be reduced by means of the identity:

$$F=x*F_x+x'*F_{x'}.$$

This process can be nested as well, but there will always be an initial control predicate that is unconditional, followed by a nested sequence of conditional control predicates. An unconditional version of a nested control predicate can be easily generated by simply producing a replica of the conditional predicate outside the outermost IF statement.

Given the computation with conditionals described as above, further optimizations can be applied. These optimizations are known in the compiler community, especially in the work performed on predicated compilation and reverse-IF conversion of programs. There is a choice between implementing the original assignment "y:=f(c;x)" and the version with the IF statement. Both implementations are valid, and either one can be chosen.

Note that in all cases above, because the transformation provides a direct translation (1-to-1 mapping) from the synchronous netlist to the dataflow graph, the transformation is reversible.

Conversion to/from Synchronous Signals.

Figure 9:
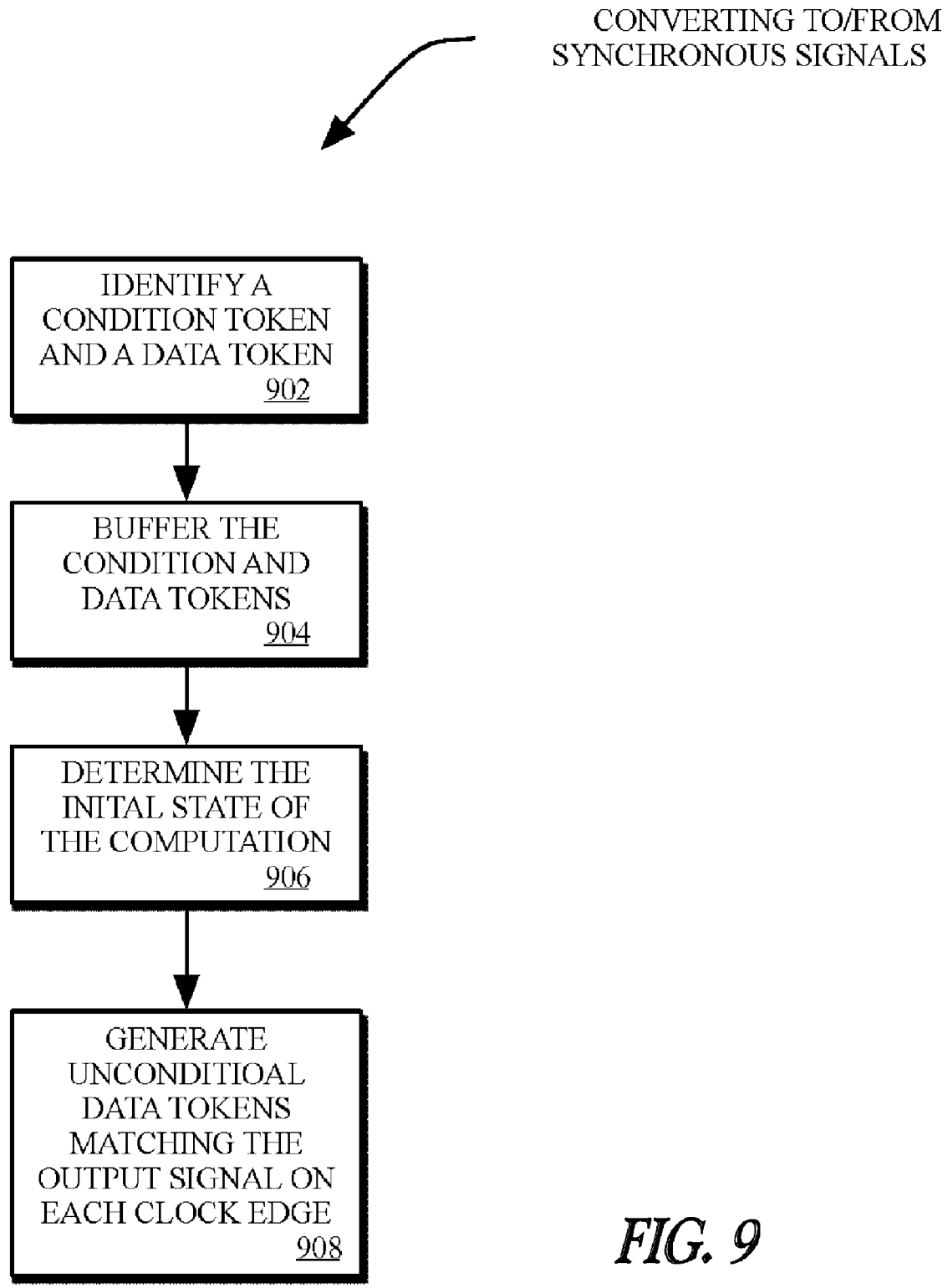
FIG. 9 is a flow chart of a process for converting an asynchronous design representation to a synchronous design representation.

There is described hereinabove methods and systems for converting from synchronous-to-dataflow-to-synchronous designs. There is now described with respect to FIG. 9 a more detailed process for converting between dataflow and synchronous designs. The dataflow graph is amenable to timing analysis using a variety of techniques, including marked graphs and event-rule systems. Both techniques result in an analytical expression for the cycle period of the computation. This period determines the minimum cycle time at which the computation can (and will) proceed. Conversion of a signal from a dataflow design back to the synchronous domain can only occur if the synchronous result is required at a lower frequency than the speed of the dataflow computation.

As is know in the art, a marked graph is a special condition of a Petri net wherein every place has one incoming arc and one outgoing art so there can be no conflicts but there can be concurrency. Petri nets themselves are nets of place, transitions and directed arcs between the places and transitions. Marked graphs can be used to represent asynchronous logic circuits and/or dataflow graphs to determine computation times. Event-rule systems use similar stochastic techniques based on Petri net analysis to determine event timing and hence asynchronous circuit timing. See, for example, *Stochastic Cycle Period Analysis in Timed Circuits*, Mercer, Eric G and Myers, Chris J., Electrical Engineering Department, University of Utah.

To convert a dataflow value into a synchronous value, we need two items: (i) the dataflow predicate that specifies the condition when the token is generated (called the condition token); (ii) The dataflow channel on which the token is generated (the data token) (step 902). Both these items are preserved via the conversion method above. There are many methods by which these two tokens can be used to generate a synchronous output.

As is known in the art, a condition token is a Boolean-valued data token that specifies if a data value is going to be generated by the data input. Similarly, a data token is a value that is generated by a computation, but it is only generated conditionally. So, for example, if the condition token value is 0, then no data token is to be expected from the computation. However, when the condition token value is 1, then a valid data token is to be expected from the computation that holds the correct data value.

It will be understood that the condition token will be generated at an average frequency that exceeds the clock signal against which the data is being synchronized. However, due to pipeline dynamics, there may be short-term variances in timing of the condition token. To account for these variances, we include a k-place FIFO that holds the condition token and another one that holds the data token (904). The value k is determined by an analysis of the dynamics of the dataflow graph. Using a FIFO eliminates the variations in frequency.

Figure 5:
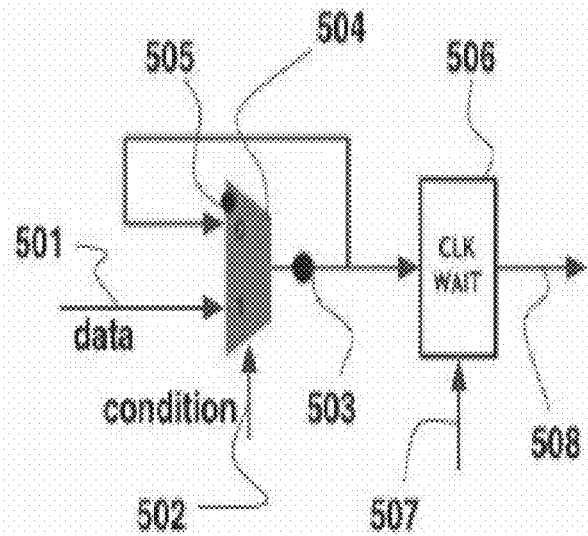
FIG. 5 is a circuit diagram, the functions of which are described here in below.

To convert the conditional data into unconditional data (corresponding to one data item per clock edge), we must know the initial value of the data. This value is easily determined by the initial state of the computation (step 906). Finally, we use an asymmetric MERGE element to generate unconditional data tokens that match the value of the output signal on every clock edge (step 908). FIG. 5 describes the circuit needed to perform the conversion from the asynchronous design to the generation of the unconditional data tokens describing the synchronous design.

With reference to FIG. 5, the output of the data FIFO is the asynchronous dataflow data signal 501, which is connected to the asymmetric MUX 504 input labeled "1". The output of the condition FIFO is dataflow signal 502. The initial value of the data is stored in the initial token 503. The output of the asymmetric MUX 504 is connected back to its asymmetric input 505. The asymmetric MUX operates as follows: it always receives a token on the condition input 502, and the asymmetric data input 505. If the condition token is "1", it receives another token on data input 501 and produces that value on its output; otherwise it sends the value it received on its asymmetric input to its output. This converts the conditional data token stream into an unconditional token stream that is sent to the CLK WAIT block 506. Depending on whether the output is to be generated right after the positive edge or the negative edge of the clock 507, the CLK WAIT block waits for the appropriate clock edge to arrive and then produces a single data signal output 508 that has the same value as the dataflow token value received on its input. This effectively aligns the dataflow tokens to the clock edge. The primary function of the clock input is simply to delay the generation of the output signal, preventing multiple signal changes per clock cycle in the synchronous output domain. Note that the clock 507 might have to be delayed by a fixed number of cycles (with respect to initialization) so as to ensure that the first token has arrived on the input to the CLK WAIT block. An upper bound on the delay amount is deterministic and can be determined from the data flow graph. Finally, if an output signal should be generated at a fixed offset from a particular clock edge, a delay-locked loop (or some other delay mechanism) can be used to generate the appropriate delayed version of the clock and it is the delayed version of the clock that should be connected to 507.

There are other variations on the design of the asymmetric MUX 504. For example, one might implement the same block without feedback but with a local state-holding element that holds the last value produced on the output. This register is initialized with the initial value of the data signal. If the control input is "0", the value of the register is produced on the output; if the control input is "1", then the value of the register is overwritten by the data received on input 501 and this new value is sent on the output.

Figure 6:
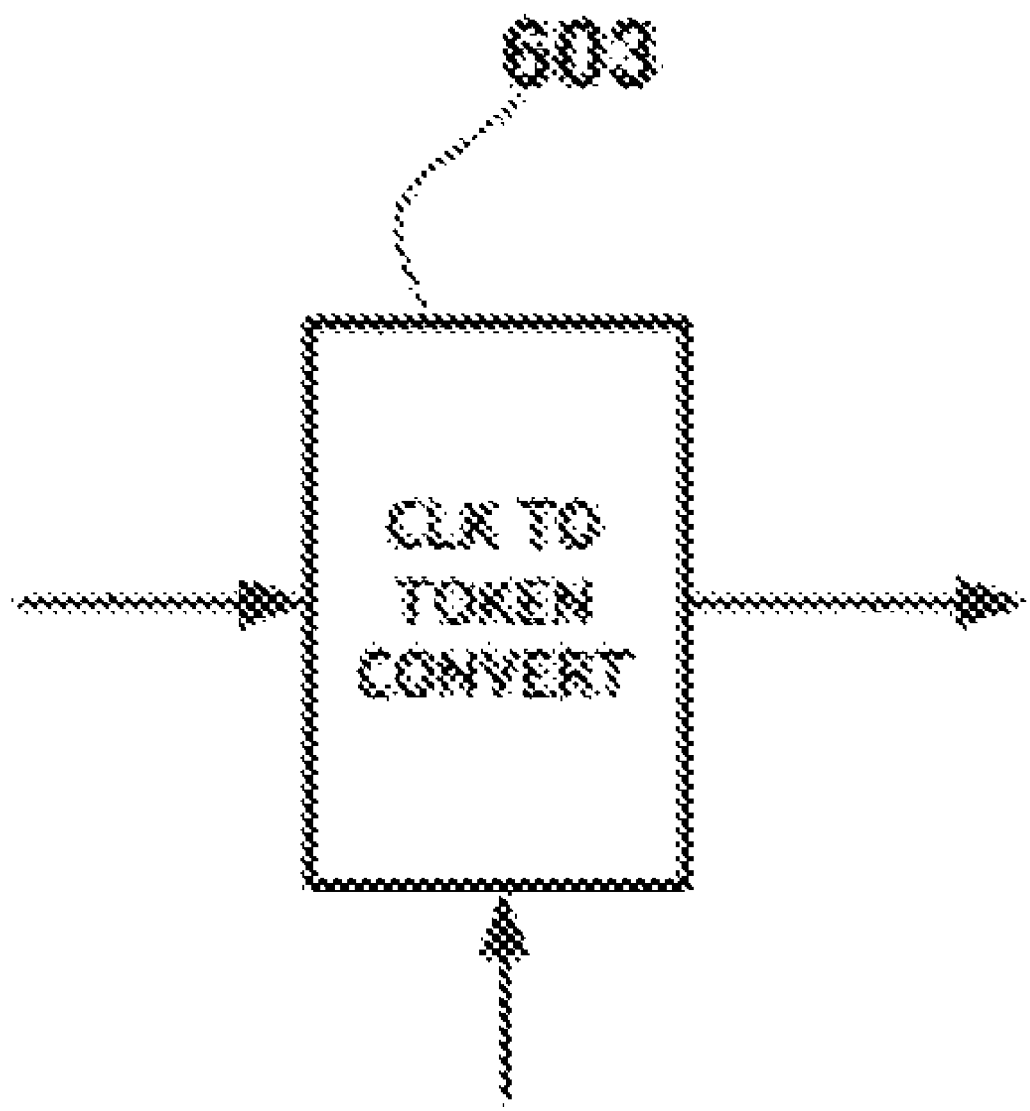
FIG. 6 is a circuit block diagram, the function of which are described here in below.

The inverse process is required when primary inputs to the circuit are provided synchronously. With reference also to FIG. 6, the data signal and its clock are used together to produce a data token output. This token is generated (once again) at a fixed offset from a specified clock in the same manner sketched above (i.e. by introducing a delayed version of the clock edge using a delay-locked loop or other technique). The circuit assumes that the dataflow graph that receives the token from the primary input operates fast enough that the token on its output will never be blocked. This is true if the input arrives at a rate that is lower than the frequency of the asynchronous dataflow computation. This structure injects one data token per clock edge into the dataflow graph.

The specific circuit implementations for the clock to token conversion 603, the asymmetric MUX 504, and the CLK WAIT block 506 will depend on the specific details of the representation of the dataflow tokens.

The reader will understand that there are many techniques that can be used to implement the principles of conversion described above. These include, but are not limited to, program transformations and/or rewriting systems that can be used to convert the synchronous computation into a dataflow implementation, and compiler approaches that use a graph-based representation of the program and use compiler analyses for optimization and graph restructuring.

The dataflow graph can be implemented using a variety of techniques as is well-understood in the art. Examples of these techniques include deeply pipelined asynchronous logic and synchronous circuits with valid bits for flow control attached to each data item. The details of the circuits and data token representation can also be varied, resulting in different trade-offs between area, performance, and power consumption. A mixture of circuit techniques can also be used, where various parts of the graph are implemented with different circuit techniques, with the introduction of representation converters for interfacing. Such techniques also are well-known in the art.

The present invention has provided new and improved methods and systems for conversion of synchronous circuit representations to asynchronous circuit representations. By providing an optimized, automated, non-Interactive conversion of representations of synchronous circuit designs to and from representations of asynchronous circuit designs, the invention allows traditional electronic design automation (EDA) tools to process and manipulate asynchronous designs while allowing synchronous designs to be implemented using asynchronous hardware solutions. The invention also facilitates feedback to synchronous design tools in synchronous representation for optimization and iteration of the design process by engineers, eliminating the need for engineers to be aware of the underlying asynchronous architecture of the underlying hardware implementation.

While the invention has been shown and described with respect to particular embodiments, it is not thus limited. Numerous modifications, changes and enhancements within the scope of the invention will now occur to the reader.

What is claimed is:

1. A method of converting between an asynchronous circuit design and a synchronous circuit design, comprising:
identifying, by a computer, a synchronous design comprising multiple clock domains;
generating a synchronous netlist of the synchronous design; and
converting the synchronous netlist to an asynchronous design, the converting including determining a repeating period that corresponds to a least common multiple of all clock cycle times.

2. The method of claim 1 wherein the synchronous netlist comprises a standardized synchronous netlist including modules from an originating electronic design interface format.

3. The method of claim 1 wherein the converting is performed automatically without human intervention.

4. The method of claim 1 wherein an asynchronous design representation of the asynchronous design is selected from a group including a dataflow graph, a detailed description of the implementation of a dataflow graph, or a high-level language.

5. The method of claim 1 wherein the converting includes generating annotations that translate performance characteristics of the asynchronous design back into a synchronous domain to validate timing characteristics of the asynchronous design.

6. The method of 1 wherein the asynchronous design comprises a dataflow graph including data represented as tokens.

7. The method of claim 6 wherein the netlist includes at least one of a group comprising a synchronous clock, a synchronous clock frequency, a multi-cycle path, an input restraint, or an output restraint.

8. The method of claim 7 wherein the synchronous netlist includes combinational logic gates and state-holding logic gates.

9. The method of claim 8 wherein the dataflow graph includes at least one of a group including a function block, a source block, a sink block, a copy block, a merge block, or an initial block.

10. The method of claim 9 wherein the synchronous design comprises a single clock domain and the converting includes:
ignoring clock and clock enable inputs;
grouping combinational logics by operations; and
specifying a logic computation of the combinational logics.

11. The method of claim 10 and further including assuming an ideal logic delay and state-holding elements.

12. The method of claim 9 wherein the synchronous design includes a state-holding element with a gated clock, the converting including at least one of a group including eliminating a gating through substitution of a MUX transformation, or using gating information to make an output of the state-holding element a conditional signal.

13. The method of claim 9 and further including, for a selected asynchronous combinational logic function in the asynchronous design:
identifying a condition token and a data token for the selected asynchronous combinational logic function;
buffering the condition token and data token; and
generating an unconditional data token matching the value of an output of the selected asynchronous combinational logic function for every clock signal of the selected asynchronous combinational logic function to convert the asynchronous combinational logic function back to a synchronous combinational logic function.

14. The method of claim 6 wherein the dataflow graph is implemented using synchronous logic.

15. The method of claim 1 and further including maintaining the state-holding elements from each clock domain separate.

16. The method of claim 1 wherein an asynchronous design representation of the asynchronous design includes synchronous input signals and synchronous output signals.

17. The method of claim 1 and further including generating an asynchronous netlist based upon the asynchronous design, the asynchronous netlist being used for implementing the asynchronous design on a field programmable gate array.

18. A system for converting between an asynchronous circuit design and a synchronous circuit design, comprising:
a synchronous design file comprising multiple clock domains;
a synthesis tool connected to receive the synchronous design file and generate a synchronous netlist of the synchronous design; and
a converter connected to receive the synchronous netlist and to convert the synchronous netlist to an asynchronous design, the converter configured to determine a repeating period that corresponds to a least common multiple of all clock cycle times.

19. The system of claim 18 wherein the synchronous netlist comprises a standardized synchronous netlist including modules from an originating electronic design interface format.

20. The system of claim 18 wherein an asynchronous design representation of the asynchronous design is selected from a group including a dataflow graph, a detailed description of an implementation of a dataflow graph, or a high-level language.

21. The system of claim 18 and further including an annotation generator connected to receive the asynchronous design and generate annotations that translate performance characteristics of the asynchronous design back into a synchronous domain to validate timing characteristics of the asynchronous design.

22. The system of 18 wherein the asynchronous design is a dataflow graph including data represented as tokens.

23. A system for converting between an asynchronous circuit design and a synchronous circuit design, comprising:
means for identifying a synchronous design comprising multiple clock domains;
means for generating a synchronous netlist of the synchronous design; and
means for converting the synchronous netlist to an asynchronous design, the means for converting including means for determining a repeating period that corresponds to a least common multiple of all clock cycle times.

24. A program product comprising a computer-readable storage medium for converting between an asynchronous circuit design and a synchronous circuit design, the program product comprising a computer-readable storage medium operative by a computer and storing control instructions operative on the computer, which when executed cause the computer to perform:

identifying a synchronous design comprising multiple clock domains;

generating a synchronous netlist of the synchronous design; and converting the synchronous netlist to an asynchronous design, the converting including determining a repeating period that corresponds to a least common multiple of all clock cycle times.

* * * * *